United States Patent
Kim (10) Patent No.: US 10,454,058 B2
(45) Date of Patent: Oct. 22, 2019

(54) ORGANIC LIGHT EMITTING DIODE DISPLAY DEVICE AND MANUFACTURING METHOD THEREOF

(71) Applicant: SAMSUNG DISPLAY CO., LTD., Yongin-si, Gyeonggi-do (KR)

(72) Inventor: Moojong Kim, Suwon-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/825,359

(22) Filed: Nov. 29, 2017

(65) Prior Publication Data

US 2018/0159065 A1    Jun. 7, 2018

(30) Foreign Application Priority Data

Dec. 1, 2016 (KR) .................. 10-2016-0162811

(51) Int. Cl.
  *H01L 27/32* (2006.01)
  *H01L 51/52* (2006.01)
(52) U.S. Cl.
  CPC ........ *H01L 51/5203* (2013.01); *H01L 27/326* (2013.01); *H01L 27/3206* (2013.01); *H01L 27/3248* (2013.01); *H01L 27/3258* (2013.01); *H01L 27/3276* (2013.01); *H01L 51/5253* (2013.01); *H01L 2227/323* (2013.01)
(58) Field of Classification Search
  CPC ............ H01L 27/3206; H01L 27/3258; H01L 27/326; H01L 27/3276; H01L 27/3248
  See application file for complete search history.

(56) References Cited

U.S. PATENT DOCUMENTS

| 2014/0332768 | A1 | 11/2014 | Kwon et al. |
| 2015/0179680 | A1 | 6/2015 | Tsuno et al. |
| 2016/0098960 | A1 | 4/2016 | Park |
| 2016/0104756 | A1 | 4/2016 | Lee et al. |
| 2016/0189609 | A1 | 6/2016 | Seo et al. |
| 2016/0210896 | A1 | 7/2016 | Gil |

FOREIGN PATENT DOCUMENTS

| KR | 10-2011-0079148 | 7/2011 |
| KR | 10-2016-0041097 | 4/2016 |
| KR | 10-2016-0042322 | 4/2016 |
| KR | 10-2016-0082867 | 7/2016 |

OTHER PUBLICATIONS

Extended European Search Report dated May 4, 2018 for European Patent Application No. 17204548.6.

*Primary Examiner* — Douglas M Menz
(74) *Attorney, Agent, or Firm* — F. Chau & Associates, LLC (57) ABSTRACT

An organic light emitting diode display device includes a substrate. A first protective layer is disposed on the substrate. A conductive line is disposed on the first protective layer. A second protective layer is disposed on the conductive line. A first electrode is disposed on the second protective layer. An organic light emitting layer is disposed on the first electrode. A second electrode is disposed on the light emitting layer. The first electrode is symmetric with respect to a center of the conductive line.

10 Claims, 11 Drawing Sheets

ORGANIC LIGHT EMITTING DIODE DISPLAY DEVICE AND MANUFACTURING METHOD THEREOF

CROSS-REFERENCE TO RELATED APPLICATION

This application claims priority under 35 U.S.C. § 119 to Korean Patent Application No. 10-2016-0162811, filed on Dec. 1, 2016, in the Korean Intellectual Property Office (KIPO), the disclosure of which is incorporated by reference herein in its entirety.

1. TECHNICAL FIELD

The present disclosure relates to an organic light emitting diode ("OLED") display device and a method of manufacturing the OLED display device.

2. DISCUSSION OF RELATED ART

Organic light emitting diode ("OLED") display devices are a type of self-luminous display device that displays an image using OLEDs that emit light. OLED display devices have characteristics such as low power consumption, high luminance, and high respond speed. OLED display devices generally have a multilayer structure including an OLED. Due to the multilayer structure, as an OLED display device emits light from the OLEDs, a viewing angle-dependent color shift may occur. Particularly, when a lower portion of a pixel electrode is not symmetric or uniform, the recognized color may change according to the viewing direction.

SUMMARY

An organic light emitting diode display device includes a substrate. A first protective layer is disposed on the substrate. A conductive line is disposed on the first protective layer. A second protective layer is disposed on the conductive line. A first electrode is disposed on the second protective layer. An organic light emitting layer is disposed on the first electrode. A second electrode is disposed on the light emitting layer. The first electrode is symmetric on a plane with respect to a center of the conductive line.

An organic light emitting diode display device includes a substrate. A first protective layer is disposed on the substrate. The first protective layer has a recess disposed therein. A conductive line is disposed within the recess of the first protective layer. A second protective layer is disposed on the conductive line. A first electrode is disposed on the second protective layer. An organic light emitting layer is disposed on the first electrode. A second electrode is disposed on the light emitting layer. The first electrode overlaps the recess of the first protective layer.

A method of manufacturing an organic light emitting diode display device includes forming a photosensitive material layer on a substrate by applying a photosensitive material onto the substrate. A first protective layer is formed on the substrate by patterning the photosensitive material layer. The first protective layer has a recess and a contact hole therein. A conductive line is formed within the recess of the first protective layer. A second protective layer is formed on the conductive line. A first electrode is formed on the second protective layer. A light emitting layer is formed on the first electrode. A second electrode is formed on the light emitting layer. The first electrode overlaps the recess of the first protective layer.

BRIEF DESCRIPTION OF THE DRAWINGS

A more complete appreciation of the present disclosure and many of the attendant aspects thereof will become more apparent by describing in detail exemplary embodiments thereof with reference to the accompanying drawings, wherein.

DETAILED DESCRIPTION

Exemplary embodiments of the present disclosure will now be described more fully hereinafter with reference to the accompanying drawings. Although the invention can be modified in various manners and have several exemplary embodiments, exemplary embodiments of the present disclosure are illustrated in the accompanying drawings and will be mainly described in the specification. However, the scope of the invention is not limited to the exemplary embodiments and should be construed as including all the changes, equivalents, and substitutions included in the spirit and scope of the invention.

In the drawings, thicknesses of a plurality of layers and areas may be illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Further when a layer, area, or plate is referred to as being "below" another layer, area, or plate, it may be directly below the other layer, area, or plate, or intervening layers, areas, or plates may be present therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Hereinafter, an exemplary embodiment of the present disclosure will be described with reference to FIGS. 1, 2 and 3.

Figure 1:
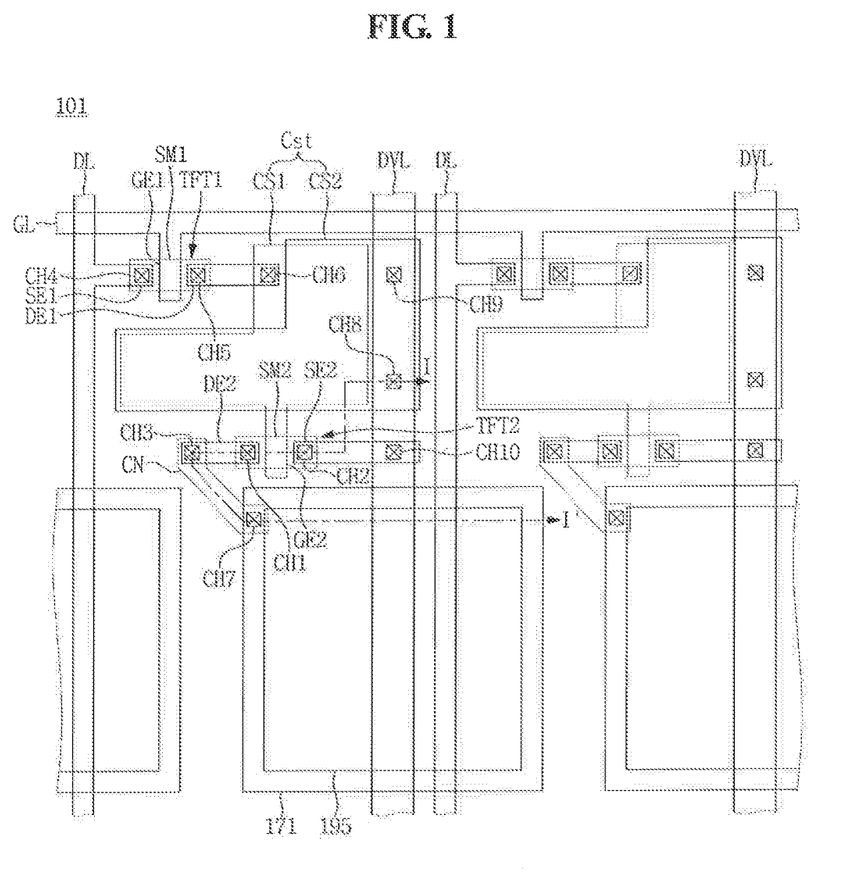
FIG. 1 is a plan view illustrating a pixel of an organic light emitting diode ("OLED") display device according to an exemplary embodiment of the present disclosure.
Figure 2:
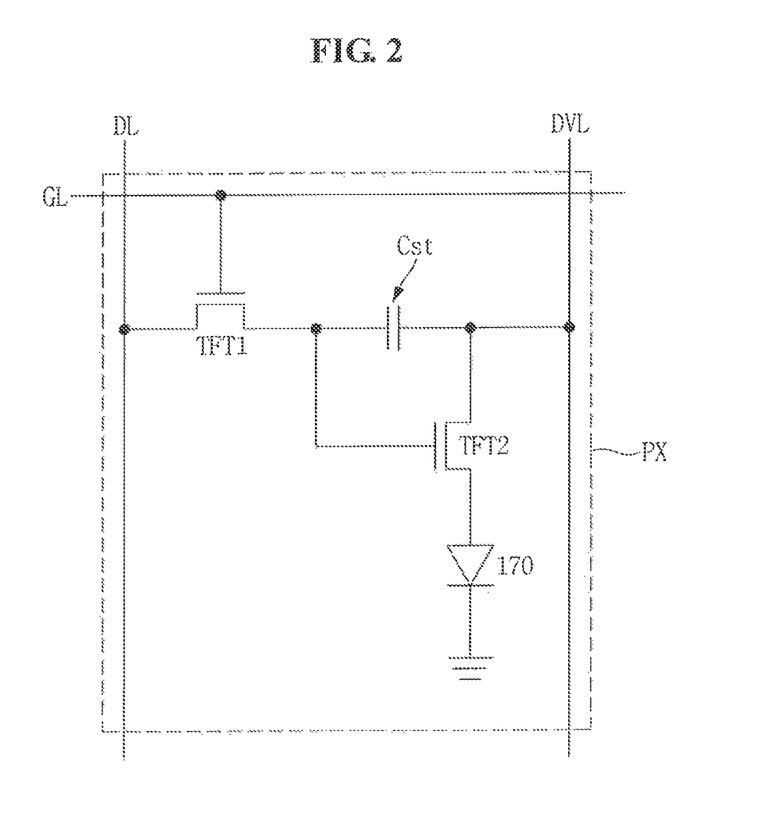
FIG. 2 is a circuit diagram illustrating one pixel illustrated in FIG. 1.
Figure 3:
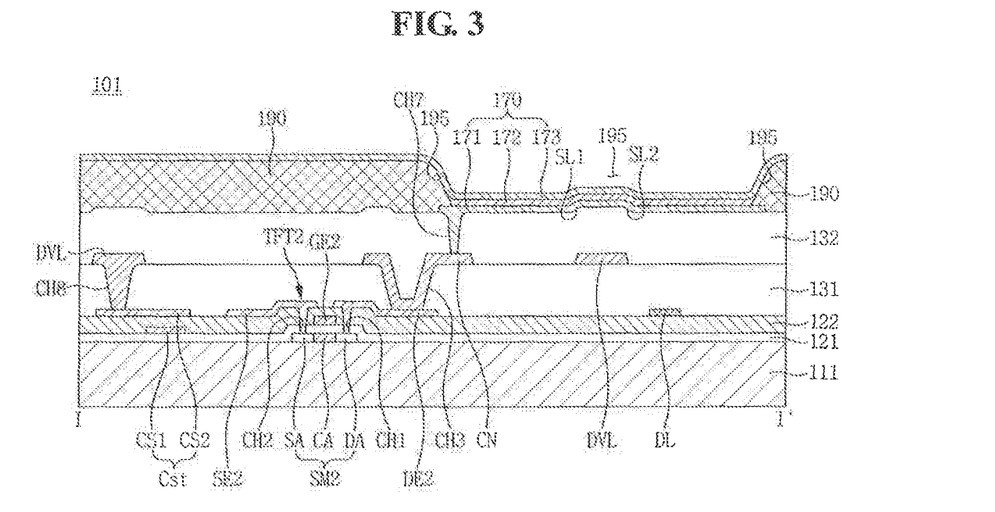
FIG. 3 is a cross-sectional view taken along line I-I' of FIG. 1.

FIG. 1 is a plan view illustrating a pixel of an organic light emitting diode ("OLED") display device 101 according to an exemplary embodiment of the present disclosure, FIG. 2 is a circuit diagram illustrating one pixel PX illustrated in FIG. 1, and FIG. 3 is a cross-sectional view taken along line I-I' of FIG. 1.

The OLED display device 101, according to an exemplary embodiment of the present disclosure, includes a plurality of pixels. The term "pixel" refers to a smallest unit for displaying an image. Referring to FIGS. 1, 2 and 3, the pixel PX includes a switching thin film transistor TFT1, a driving thin film transistor TFT2, an OLED 170 and a capacitor Cst.

The pixel PX may generate light having a predetermined color, for example, one of red, green or blue. However, the color of the light generated in the pixel PX is not limited thereto, and light having a color such as cyan, magenta or yellow may be generated in the pixel PX.

The pixel PX is connected to a gate line GL, a data line DL and a driving voltage line DVL. The gate line GL extends in one direction. The data line DL extends in another direction intersecting the gate line GL. Referring to FIG. 1, the driving voltage line DVL extends in a substantially same direction as a direction in which the data line DL extends. The gate line GL transmits a scan signal, the data line DL transmits a data signal, and the driving voltage line DVL provides a driving voltage.

The thin film transistors TFT1 and TFT2 may include a driving thin film transistor TFT2 for controlling the OLED 170 and a switching thin film transistor TFT1 for switching the driving thin film transistor TFT2. Although each pixel PX is described as including two thin film transistors TFT1 and TFT2, the invention may have fewer or more thin film transistors in each pixel. For example, each pixel PX may include one thin film transistor and a capacitor, or may include three or more thin film transistors and two or more capacitors.

A portion at which the thin film transistors TFT1 and TFT2, the gate line GL, the data line DL, the driving voltage line DVL and the capacitor Cst are disposed is referred to as a wiring unit and each of the gate line GL, the data line DL, the driving voltage line DVL and the capacitor Cst is referred to as a wiring. The thin film transistors TFT1 and TFT2 may also be one of the wirings or a part of the wiring. In addition, since the gate line GL, the data line DL and the driving voltage line DVL are electrically conductive, they may also be referred to as "a conductive line."

The switching thin film transistor TFT1 includes a first gate electrode GE1, a first source electrode SE1, a first drain electrode DE1 and a first semiconductor layer SM1. The first gate electrode GE1 is connected to the gate line GL and the first source electrode SE1 is connected to the data line DL.

The first drain electrode DE1 is connected to a first capacitor plate CS1 through a fifth contact hole CH5 and a sixth contact hole CH6. The switching thin film transistor TFT1 transmits a data signal applied to the data line DL to the driving thin film transistor TFT2 according to a scan signal applied to the gate line GL.

The driving thin film transistor TFT2 includes a second gate electrode GE2, a second source electrode SE2, a second drain electrode DE2 and a second semiconductor layer SM2. The second gate electrode GE2 is connected to the first capacitor plate CS1. The second source electrode SE2 is connected to the driving voltage line DVL through a tenth contact hole CH10. The second drain electrode DE2 is connected to a connection electrode CN through a third contact hole CH3 and the connection electrode CN is connected to a first electrode 171 through a seventh contact hole CH7.

An organic light emitting layer 172 is disposed on the first electrode 171 and a second electrode 173 is disposed on the organic light emitting layer 172. A common voltage is applied to the second electrode 173, and the organic light emitting layer 172 generates light according to an output signal of the driving thin film transistor TFT2.

The capacitor Cst is connected between the second gate electrode GE2 and the second source electrode SE2 of the driving thin film transistor TFT2. The capacitor Cst charges and maintains a signal input to the second gate electrode GE2 of the driving thin film transistor TFT2. The capacitor Cst includes the first capacitor plate CS1 that is connected to the first drain electrode DE1 through the sixth contact hole CH6. The capacitor Cst further includes a second capacitor plate CS2 that is connected to the driving voltage line DVL through an eighth contact hole CH8 and a ninth contact hole CH9.

Referring to FIG. 3, thin film transistors TFT1 and TFT2 and the OLED 170 are disposed on a substrate 111.

The type of the substrate 111 is not particularly limited. For example, the substrate 111 may include an insulating material such as glass, plastic, quartz, or the like. The material for the substrate 111 may have excellent mechanical strength, thermal stability, transparency, surface smoothness, ease of handling and water resistance.

A buffer layer may be disposed on the substrate 111. The buffer layer may substantially prevent diffusion of impurities into the switching thin film transistor TFT1 and the driving thin film transistor TFT2.

The first semiconductor layer SM1 and the second semiconductor layer SM2 are each disposed on a substrate 111. The first semiconductor layer SM1 and the second semiconductor layer SM2 each include a semiconductor material and act as active layers of the switching thin film transistor TFT1 and the driving thin film transistor TFT2, respectively. Each of the first semiconductor layer SM1 and the second semiconductor layer SM2 includes a source area SA, a drain area DA and a channel area CA that is disposed between the source area SA and the drain area DA.

The first semiconductor layer SM1 and the second semiconductor layer SM2 may each include amorphous silicon, polycrystalline silicon, or the like, or may include an oxide semiconductor. For example, each of the first semiconductor layer SM1 and the second semiconductor layer SM2 may include an inorganic semiconductor material or an organic semiconductor material. The source area SA and the drain area DA may be doped with an n-type impurity or a p-type impurity.

A gate insulating layer 121 is disposed on both the first semiconductor layer SM1 and the second semiconductor layer SM2. The gate insulating layer 121 protects the first semiconductor layer SM1 and the second semiconductor layer SM2. The gate insulating layer 121 may include an organic insulating material or an inorganic insulating material.

The first gate electrode GE1 and the second gate electrode GE2 are disposed on the gate insulating layer 121. The first gate electrode GE1 and the second gate electrode GE2 are disposed so as to overlap the channel areas CA of the first semiconductor layer SM1 and the second semiconductor layer SM2, respectively. In addition, the first capacitor plate CS1 is disposed on the gate insulating layer 121. The second gate electrode GE2 may be formed integrally with the first capacitor plate CS1.

An insulating interlayer 122 is disposed on the first gate electrode GE1, the second gate electrode GE2 and the first capacitor plate CS1. The insulating interlayer 122 may include an organic insulating material or an inorganic insulating material.

The first source electrode SE1, the first drain electrode DE1, the second source electrode SE2 and the second drain electrode DE2 are each disposed on the insulating interlayer 122. The second drain electrode DE2 contacts the drain area DA of the second semiconductor layer SM2 through a first contact hole CH1 defined in the gate insulating layer 121 and the insulating interlayer 122. The second source electrode SE2 contacts the source area SA of the second semiconductor layer SM2 through a second contact hole CH2 defined in the gate insulating layer 121 and the insulating interlayer 122. The first source electrode SE1 contacts the first semiconductor layer SM1 through a fourth contact hole CH4 defined in the gate insulating layer 121 and the insulating interlayer 122, and the first drain electrode DE1 contacts the first semiconductor layer SM1 through the fifth contact hole CH5 defined in the gate insulating layer 121 and the insulating interlayer 122.

In addition, the data line DL and the second capacitor plate CS2 are disposed on the insulating interlayer 122.

A first protective layer 131 is disposed on the first source electrode SE1, the first drain electrode DE1, the second source electrode SE2, the second drain electrode DE2, the data line DL, and the second capacitor plate CS2. The first protective layer 131 serves to protect the switching thin film transistor TFT1 and the driving thin film transistor TFT2 and also serves to planarize upper surfaces thereof.

According to an exemplary embodiment of the present disclosure, the first protective layer 131 may include a photosensitive material. For example, the first protective layer 131 may include a photosensitive polymer resin.

The driving voltage line DVL and the connection electrode CN are disposed on the first protective layer 131.

The driving voltage line DVL and the connection electrode CN may be formed in a same process using a same material.

For example, the driving voltage line DVL includes a conductive material. For example, the driving voltage line DVL, may include or be formed of aluminum (Al) or alloys thereof, silver (Ag) or alloys thereof, copper (Cu) or alloys thereof, molybdenum (Mo) or alloys thereof, chromium (Cr), tantalum (Ta) and/or titanium (Ti). In addition, the driving voltage line DVL may have a multilayer structure including a refractory metal layer and a low resistance conductive layer. As such, the driving voltage line DVL is a conductive line including a conductive material.

The driving voltage line DVL is connected to the second capacitor plate CS2 through the eighth contact hole CH8 and the ninth contact hole CH9 defined in the first protective layer 131. In addition, the driving voltage line DVL is connected to the second source electrode SE2 through the tenth contact hole CH10 defined in the first protective layer 131.

The connection electrode CN is connected to the second drain electrode DE2 through the third contact hole CH3 defined in the first protective layer 131.

A second protective layer 132 is disposed on the driving voltage line DVL and the connection electrode CN. According to an exemplary embodiment of the present disclosure, the second protective layer 132 may include a photosensitive material. For example, the second protective layer 132 may include a photosensitive polymer resin.

The second protective layer 132 serves to protect the driving voltage line DVL and the connection electrode CN and also serves to planarize upper surfaces thereof. However, in the case where the driving voltage line DVL and the connection electrode CN are relatively thick as compared to the second protective layer 132, the upper portion of the driving voltage line DVL and the connection electrode CN might not be completely planarized by the second protective layer 132. Due to the high level of integration of the wiring, a large amount of current or data may need to be transmitted within a wiring of a relatively small area. Accordingly, the wiring may be relatively thick. In the case where thick wiring is used, although the second protective layer 132 is disposed above these wirings, for example, the driving voltage line DVL and the connection electrode CN, the upper portion thereof might not be completely planarized. Referring to FIG. 3, the second protective layer 132 includes slopes SL1 and SL2 above the driving voltage line DVL.

The first electrode 171 is disposed on the second protective layer 132. The first electrode 171 is also disposed on the slopes SL1 and SL2 formed at the second protective layer 132. The first electrode 171 may be, for example, an anode. According to an exemplary embodiment of the present disclosure, the first electrode 171 is a pixel electrode.

The first electrode 171 is connected to the connection electrode CN through the seventh contact hole CH7 defined in the second protective layer 132. As the connection electrode CN is connected to the second drain electrode DE2 through the third contact hole CH3 defined in the first protective layer 131, the first electrode 171 may be electrically connected to the second drain electrode DE2 of the driving thin film transistor TFT2.

Referring to FIG. 3, the driving voltage line DVL is disposed below the first electrode 171. The first electrode 171 overlaps the driving voltage line DVL.

The driving voltage line DVL is one of the conductive lines, and the first electrode 171 is symmetric with respect to the driving voltage line DVL which is one of the conductive lines. For example, the first electrodes 171 is arranged symmetrically on a plane with respect to the driving voltage line DVL.

Referring to FIG. 1, the driving voltage line DVL may be relatively straight, and the first electrode 171 is bilaterally symmetric with respect to the driving voltage line DVL. However, exemplary embodiments of the present disclosure are not limited thereto. The driving voltage line DVL may have a curved shape or a broken line shape, and the first electrode 171 may be arranged vertically symmetrically with respect to the driving voltage line DVL.

A pixel defining layer 190 partitioning a light emission area is disposed on the second protective layer 132.

The pixel defining layer 190 may include a polymer organic material. The pixel defining layer 190 may include a polyimide (PI) resin, a polyacrylic resin, a polyethylene terephthalate (PET) resin and/or a polyethylene naphthalate (PEN) resin. According to an exemplary embodiment of the present disclosure, the pixel defining layer 190 includes a PI resin.

The pixel defining layer 190 defines an opening 195 and the first electrode 171 is exposed from the pixel defining layer 190 through the opening 195. In addition, the light emission area of the OLED 170 is defined by the opening 195.

Referring to FIGS. 1 and 3, the first electrode 171 overlaps at least a portion of the pixel defining layer 190 and does not overlap the pixel defining layer 190 at the opening 195.

According to an exemplary embodiment of the present disclosure, the openings 195 is symmetric on a plane with respect to the drive voltage line DVL, which is one of the conductive lines.

The first electrode 171 is electrically conductive, and may be a transmissive electrode, a transflective electrode or a reflective electrode. In the case where the first electrode 171 is a transmissive electrode, the first electrode 171 includes a transparent conductive oxide. For example, the transparent conductive oxide may include indium tin oxide (ITO), indium zinc oxide (IZO), zinc oxide (ZnO), and/or indium tin zinc oxide (ITZO). In the case where the first electrode 171 is a transflective electrode or a reflective electrode, the first electrode 171 may include Ag, Mg, Al, Pt, Pd, Au, Ni, Nd, Ir, Cr, and/or Cu.

The organic light emitting layer 172 is disposed on the first electrode 171. For example, the organic light emitting layer 172 is disposed at the opening 195 on the first electrode 171. The organic light emitting layer 172 may be disposed on a sidewall of the opening 195 defined by the pixel defining layer 190 and on the pixel defining layer 190.

The organic light emitting layer 172 includes a light emitting material. In addition, the organic light emitting layer 172 may include a host and a light emitting dopant. The organic light emitting layer 172 may be manufactured in accordance with a known method using a known material. For example, the organic light emitting layer 172 may be formed using various methods such as a vacuum deposition method, a spin coating method, a cast method, a Langmuir-Blodgett (LB) method, an inkjet printing method, a laser printing method, a laser induced thermal imaging (LITI) method, and the like.

A hole injection layer (HIL) and/or a hole transport layer (HTL) may be disposed between the first electrode 171 and the organic light emitting layer 172.

The second electrode 173 is disposed on the organic light emitting layer 172.

The second electrode 173 may be a common electrode and may be a cathode. The second electrode 173 may be a transmissive electrode, a transflective electrode or a reflective electrode.

In the case where the second electrode 173 is a transmissive electrode, the second electrode 173 may include Li, Ca, LiF/Ca, LiF/Al, Al, Mg, BaF, Ba, Ag and/or Cu. For example, the second electrode 173 may include a mixture of Ag and Mg.

In the case where the second electrode 173 is a transflective electrode or a reflective electrode, the second electrode 173 may include Ag, Mg, Al, Pt, Pd, Au, Ni, Nd, Ir, Cr, Li, Ca, LiF/Ca, LiF/Al, Mo, Ti and/or Cu. In addition, the second electrode 173 may further include a transparent conductive layer including indium tin oxide (ITO), indium zinc oxide (IZO), zinc oxide (ZnO), indium-zinc-tin oxide (IZTO), and the like, in addition to the transflective electrode or the reflective electrode.

At least one of an electron transport layer (ETL) and an electron injection layer (EIL) may be disposed between the organic light emitting layer 172 and the second electrode 173.

In the case where the OLED 170 is a top emission type, the first electrode 171 may be a reflective electrode and the second electrode 173 may be a transmissive electrode or a transflective electrode. When the OLED 170 is a bottom emission type, the first electrode 171 may be a transmissive electrode or a transflective electrode, and the second electrode 173 may be a reflective electrode.

According to an exemplary embodiment of the present disclosure, the OLED 170 is a top emission type, the first electrode 171 is a reflective electrode, and the second electrode 173 is a transflective electrode.

Figure 4:
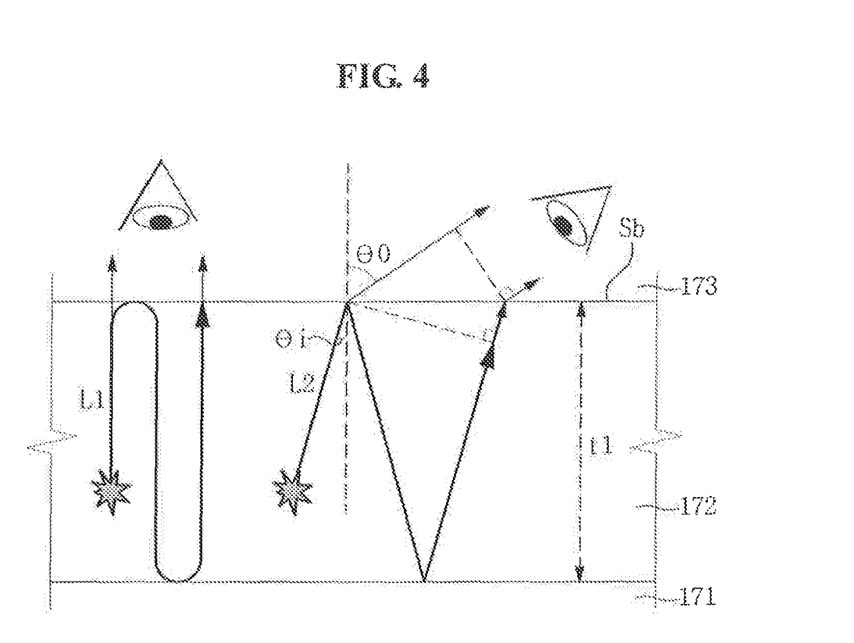
FIG. 4 is a cross-sectional view illustrating white angular dependency (WAD)

FIG. 4 is a cross-sectional view illustrating white angular dependency (WAD).

The OLED display device 101 has a multilayer stack structure (see FIG. 3), and light emitted from the organic light emitting layer 172 is emitted outwardly, passing through the multilayer structure. According to an exemplary embodiment of the present disclosure, the light generated in the organic light emitting layer 172 passes through the second electrode 173 to be emitted outwardly.

When optical resonance occurs in the course of light repeating being reflected between two reflective surfaces, energy of the light increases and the light having the increased energy may pass through the multilayer stacked structure to be emitted outwardly. Such a structure to allow light to resonate between two reflective layers is called a resonance structure, and a distance between the two reflective layers at which resonance occurs is called a resonance distance. The resonance distance depends on the wavelength of the light.

Since the first electrode 171 is a reflective electrode and the second electrode 173 is a transflective electrode in the OLED display device 101, according to an exemplary embodiment of the present disclosure, light may be reflected between the first electrode 171 and the second electrode 173 and light resonance may occur. When a wavelength of the light emitted from the organic light emitting layer 172 is denoted as $\lambda 1$ and a distance between the first electrode 171 and the second electrode 173 is t1, light resonance may occur when the following Formula 1 is satisfied:

$$2 \cdot n1 \cdot t1 = m1 \cdot \lambda 1 \qquad \text{[Formula 1]}$$

In Formula 1, n1 denotes an average refractive index between the first electrode 171 and the second electrode 173, and m1 is an integer. In addition, the distance t1 between the first electrode 171 and the second electrode 173 is a distance between an upper surface of the first electrode 171 and a lower surface of the second electrode 173, which opposes the first electrode 171. As used herein, λ1 denotes a wavelength of light L1 emitted toward the front side.

In an exemplary embodiment of the present disclosure, although a same color is displayed in the OLED display device 101, different colors may be visually recognized depending on the viewing angle of the observer. For example, when a display surface of the display device that emits white light is viewed from the front, white is recognized, but when viewed from the side, a bluish or yellowish color may be recognized. This phenomenon is called the white angular dependency (WAD), and the WAD is known to be caused by a path difference of light depending on the viewing angle.

Referring to FIG. 4, the light L1 viewed from the front may resonate according to Formula 1.

Light L2 emitted toward the lateral side is incident to an interface Sb at an angle θi in a medium having a thickness t1 and a refractive index n1 and is emitted at an angle θo. In such an exemplary embodiment of the present disclosure, when a wavelength of the light L2 emitted toward the lateral side is denoted as λ2, the relation of the following Formula 2 is satisfied in order for the light to resonate.

$$2 \cdot n1 \cdot t1 \cdot \cos(\theta i) = m2 \cdot \lambda 2 \quad \text{[Formula 2]}$$

In Formula 2, m2 is an integer.

In such an exemplary embodiment of the present disclosure, when the incident angle θi at the interface Sb increases, a value of cos(θi) becomes smaller, and accordingly, the resonance condition may change and the resonance wavelength may change. As a result, the wavelength λ2 of the light L2 emitted toward the lateral side differs from the wavelength of the light L1 emitted toward the front side.

For example, when the incident angle θi increases, the value of cos(θi) becomes small, and accordingly, the wavelength λ2 that satisfies the resonance condition becomes small. Accordingly, the light L2 having a shorter wavelength than a wavelength of the light L1 emitted toward the front side is emitted toward the lateral side, and thus the WAD occurs.

Figure 5A:
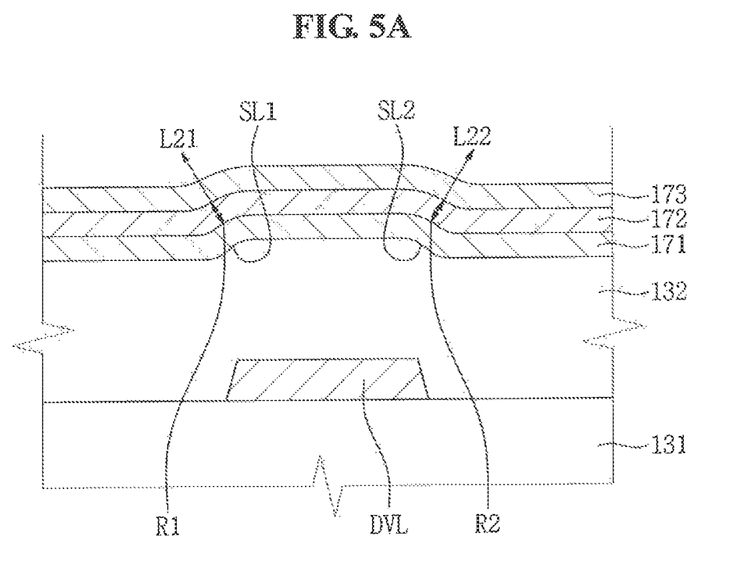
FIG. 5A is a cross-sectional view illustrating resonance at a slope.
Figure 5B:
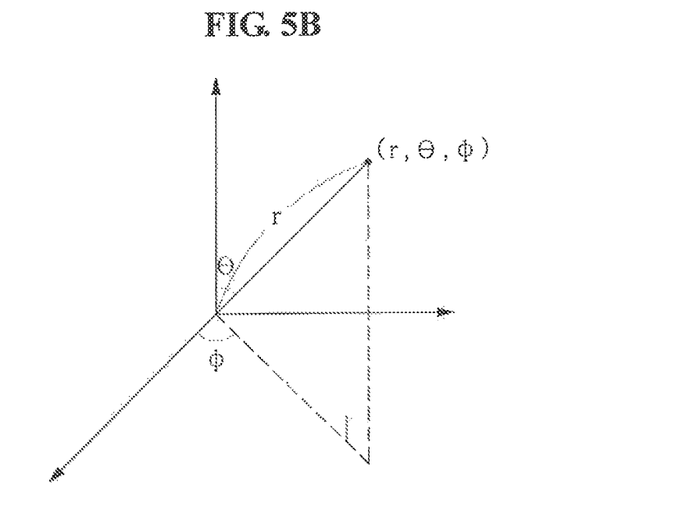
FIG. 5B is a diagram illustrating a spherical coordinate system for determining coordinates by a distance r, a tilt angle θ and an azimuth angle φ, in accordance with exemplary embodiments of the present disclosure.

FIG. 5A is a cross-sectional view illustrating resonance at a slope, and FIG. 5B is a diagram illustrating a spherical coordinate system for determining coordinates by a distance r, a tilt angle θ and an azimuth angle φ, in accordance with exemplary embodiments of the present disclosure.

As described above, light is reflected between the first electrode 171 and the second electrode 173 of the OLED display device 101, according to an exemplary embodiment of the present invention, and light resonance occurs.

Referring to FIGS. 3 and 5A, due to a thickness of the driving voltage line DVL, slopes SL1 and SL2 are formed at the second protective layer 132 above the driving voltage line DVL. In addition, resonance also occurs between the first electrode 171 and the second electrode 173 disposed on the slopes SL1 and SL2. Light L21 and light L22 resonate in the direction perpendicular to surfaces of the first electrode 171 and the second electrode 173 at the slopes SL1 and SL2. Even though light L21 and light L22 have a substantially same or similar wavelength, they are to be emitted in different directions.

For example, referring to FIG. 5A, light L21 and light L22 resonating between the first electrode 171 and the second electrode 173 at different points R1 and R2 of the slopes SL1 and SL2 are also emitted in the lateral direction.

In such an example, when a left slope SL1 and a right slope SL2 illustrated in FIG. 5A are symmetric to each other, the light L21 and light L22 respectively viewed from the left and right sides will have a substantially identical wavelength. However, when the left slope SL1 and the right slope SL2 are not symmetric to each other, the resonance conditions in the left slope SL1 and the right slope SL2 become different, and accordingly the wavelength of the observed light will be different depending on the viewing angle of the user.

FIG. 5B shows a spherical coordinate system for determining coordinates by a distance r, a tilt angle θ and an azimuth angle φ. In the case where the left slope SL1 and the right slope SL2 are asymmetric to each other, light of a different wavelength will be visually recognized according to the azimuth angle φ of the spherical coordinate system. For example, a WAD deviation occurs according to the azimuth angle φ. Such a WAD deviation degrades the display characteristics of the OLED display device 101.

According to an exemplary embodiment of the present disclosure, in order to substantially prevent degradation of the display characteristics of the OLED display device 101, the slopes SL1 and SL2 are formed symmetrically below the first electrode 171. To this end, the first electrode 171 is disposed symmetrically with respect to the driving voltage line DVL. Accordingly, the display characteristics of the OLED display device 101 may be increased.

Figure 6:
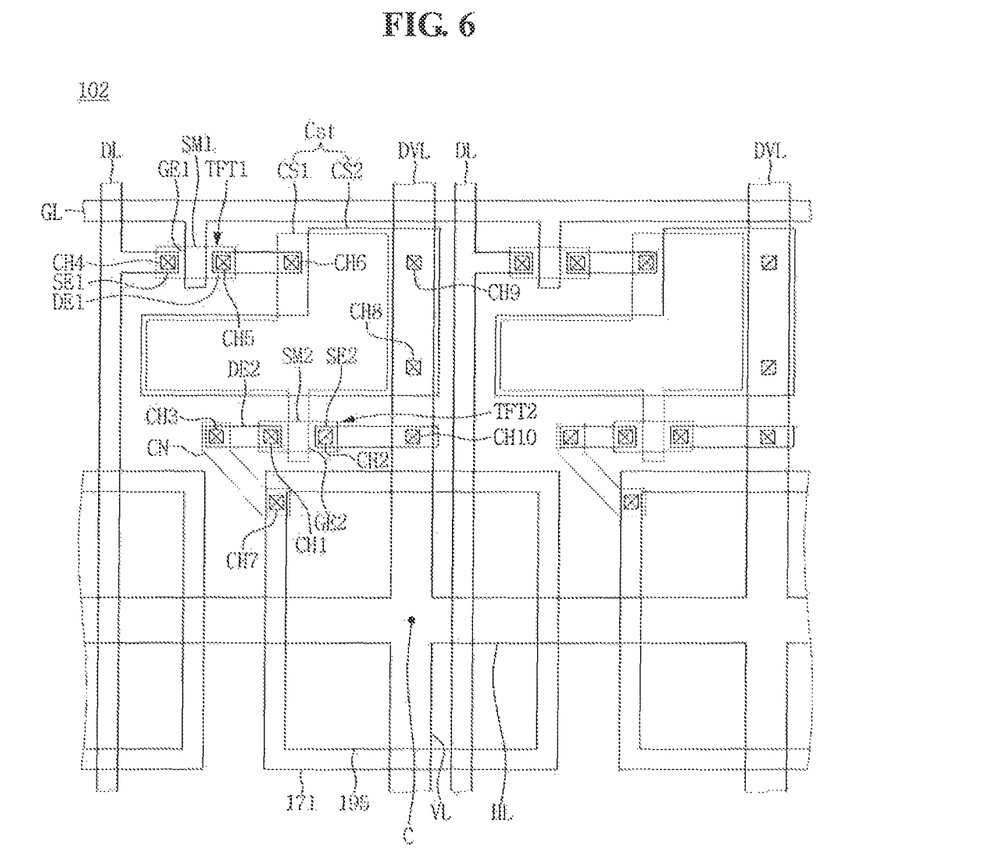
FIG. 6 is a plan view illustrating a pixel of an OLED display device according to an exemplary embodiment of the present disclosure.

FIG. 6 is a plan view illustrating a pixel of an OLED display device 102 according to an exemplary embodiment of the present disclosure.

According to an exemplary embodiment of the present disclosure, a driving voltage line DVL, on a first protective layer 131, which is a conductive line, is formed in a radial direction on a plane with respect to a center C of a first electrode 171. For example, referring to FIG. 6, the driving voltage line DVL is disposed in a cruciform (+) shape with respect to the center C of the first electrode 171. Accordingly, the first electrode 171 is horizontally symmetric and vertically symmetric with respect to the driving voltage line DVL.

Referring to FIG. 6, the driving voltage line DVL includes a horizontal line HL and a vertical line VL. According to an exemplary embodiment of the present disclosure, the driving voltage line DVL has a mesh shape in which a plurality of horizontal lines HL and a plurality of vertical lines VL are arranged in an intersecting manner.

Figure 7:
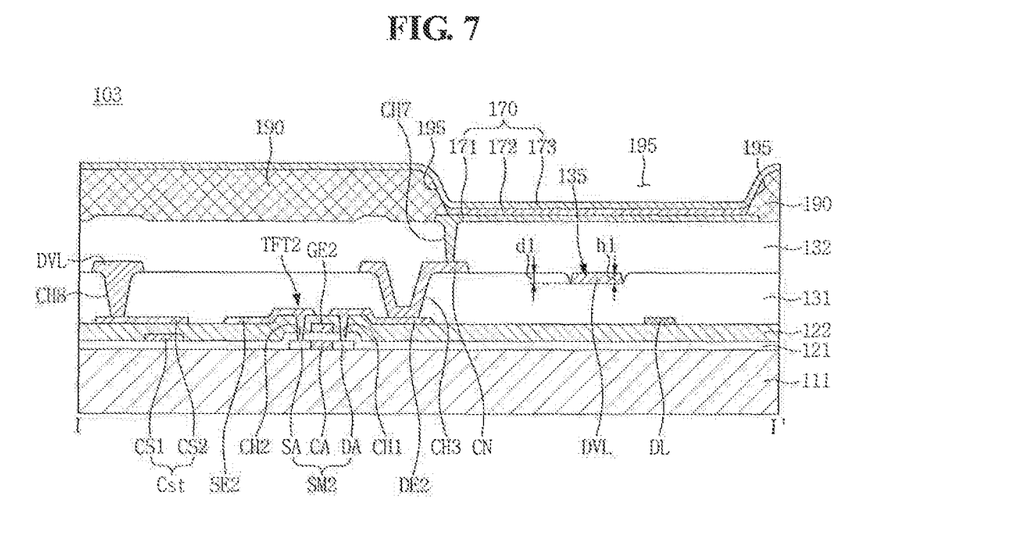
FIG. 7 is a cross-sectional view illustrating an OLED display device according to an exemplary embodiment of the present disclosure.

FIG. 7 is a cross-sectional view illustrating an OLED display device 103 according to an exemplary embodiment of the present disclosure.

Referring to FIG. 7, a first protective layer 131 includes a recess 135, and a driving voltage line DVL, which is a conductive line, is disposed at the recess 135. In such an exemplary embodiment, the recess 135 overlaps the first electrode 171. For example, the driving voltage line DVL is disposed at the recess 135 below the first electrode 171.

A depth d1 of the recess 135 is substantially equal to a thickness h1 of the driving voltage line DVL which is a conductive line. For example, the depth d1 of the recess 135 and the thickness h1 of the driving voltage line DVL may have a size difference of about 0.01 μm.

In the case where the depth d1 of the recess 135 and the thickness h1 of the driving voltage line DVL are substantially equal to each other, a second protective layer 132 is flat above the driving voltage line DVL, and the first electrode 171 may be formed on a planar surface. Accordingly, the azimuth angle-dependent WAD deviation may be substantially prevented.

However, the present invention is not limited thereto, and the depth d1 of the recess 135 may be different from the thickness h1 of the driving voltage line DVL. For example, the depth d1 of the recess 135 may be greater than or less than the thickness h1 of the driving voltage line DVL. In the case where the second protective layer 132 includes an organic material, when a difference between the depth d1 of the recess 135 and the thickness h1 of the driving voltage line DVL is not relatively large, the second protective layer 132 may have a planar surface above the driving voltage line DVL by virtue of a planarizing effect of an organic material.

Figure 8:
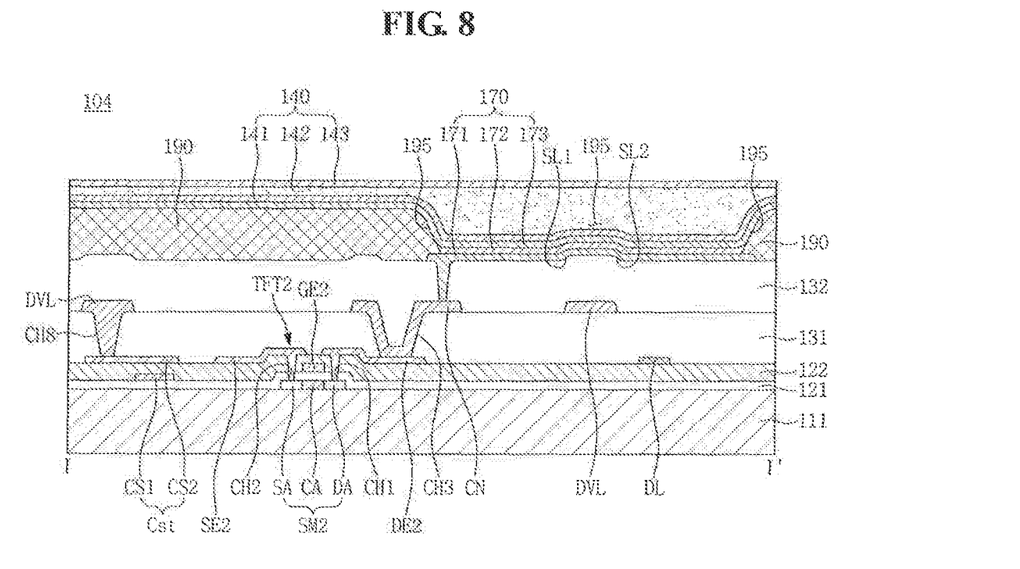
FIG. 8 is a cross-sectional view illustrating an OLED display device according to an exemplary embodiment of the present disclosure.

FIG. 8 is a cross-sectional view illustrating an OLED display device 104 according to an exemplary embodiment of the present disclosure.

The OLED display device 104 illustrated in FIG. 8 includes a thin film encapsulation layer 140 on a second electrode 173 to protect an OLED 170. The thin film encapsulation layer 140 substantially prevents moisture or oxygen from permeating into the OLED 170.

The thin film encapsulation layer 140 includes at least one inorganic layer 141 and 143 and at least one organic layer 142 that are alternately disposed. The thin film encapsulation layer 140 illustrated in FIG. 8 includes two inorganic layers 141 and 143 and one organic layer 142. However, the structure of the thin film encapsulating layer 140 is not limited to the structure illustrated in FIG. 8.

The inorganic layers 141 and 143 may include metal oxide, metal oxynitride, silicon oxide, silicon nitride, and/or silicon oxynitride. The inorganic layers 141 and 143 are formed by a chemical vapor deposition (CVD) method or an atomic layer deposition (ALD) method. However, the present invention is not limited thereto, and the inorganic layers 141 and 143 may be formed through various methods known to those skilled in the art.

The organic layer 142 may include, for example, a polymer material. The organic layer 142 may be formed through a thermal deposition process. The thermal deposition process for forming the organic layer 142 is performed within a temperature range that does not damage the OLED 170. However, the present invention is not limited thereto, and the organic layer 142 may be formed through various other methods known to those skilled in the art.

The inorganic layers 141 and 143, which have a high density of thin film, mainly suppress the permeation of moisture or oxygen. Most of moisture and oxygen are blocked by the inorganic layers 141 and 143 from penetrating into the OLED 170.

The moisture and oxygen that have passed through the inorganic layers 141 and 143 are blocked again by the organic layer 142. The organic layer 142 also functions as a buffer layer to reduce the stress between the inorganic layers 141 and 143 and the organic layer 142 in addition to the moisture permeation restraint. In addition, since the organic layer 142 has planarizing characteristics, an uppermost surface of the thin film encapsulation layer 140 may be planarized by the organic layer 142.

Since the thin film encapsulation layer 140 may be relatively thin, the organic light emitting display 104 may be thin as well. Such an OLED display device 104 may have excellent flexible characteristics.

Figure 9:
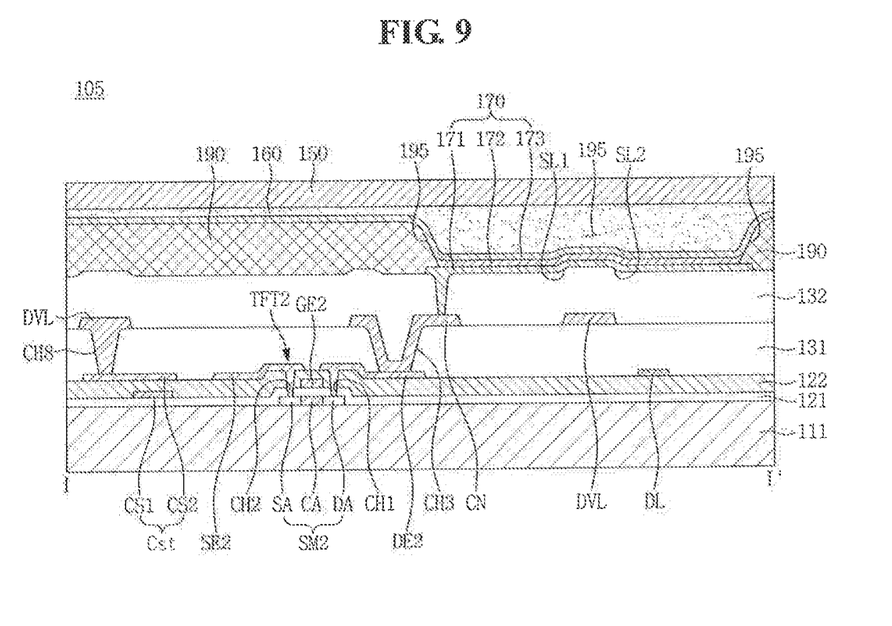
FIG. 9 is a cross-sectional view illustrating an OLED display device according to an exemplary embodiment of the present disclosure.

FIG. 9 is a cross-sectional view illustrating an OLED display device 105 according to an exemplary embodiment of the present disclosure.

The OLED display device 105 illustrated in FIG. 9 includes a sealing member 150 disposed on a second electrode 173 to protect an OLED 170.

The sealing member 150 may include a light transmissive insulating material such as glass, quartz, ceramic and plastic. The sealing member 150 has a plate shape and is attached to the substrate 111 to protect the OLED 170.

A filler 160 may be disposed between the OLED 170 and the sealing member 150. The filler 160 may include an organic material, for example, a polymer. In addition, a protective layer including a metal or an inorganic material may be disposed on the OLED 170 to protect the OLED 170. Hereinafter, a method of manufacturing the OLED display device 103 according to an exemplary embodiment of the present disclosure will be described with reference to FIGS. 10A, 10B, 10C, 10D, 10E, 10F, 10G, 10H and 10I. FIGS. 10A, 10B, 10C, 10D, 10E, 10F, 10G, 10H and 10I are views illustrating a process of manufacturing the OLED display device 103 according to an exemplary embodiment of the present disclosure.

Figure 10A:
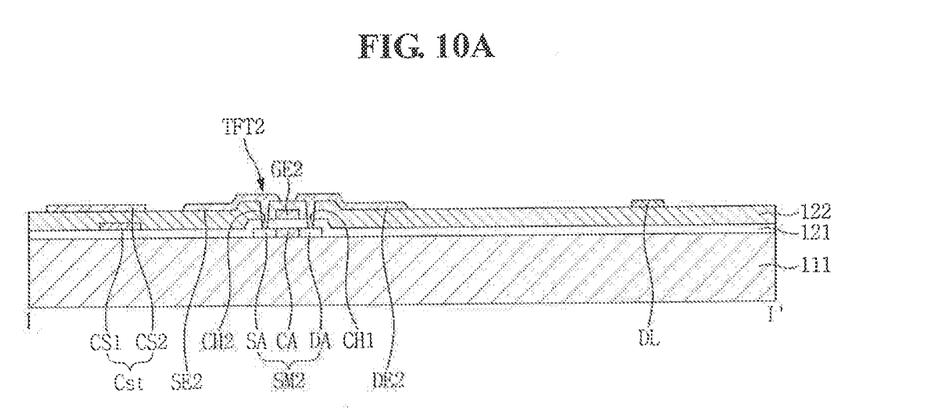
FIGS. 10A, 10B, 10C, 10D, 10E, 10F, 10G, 10H and 10I are cross-sectional views illustrating a process of manufacturing an OLED display device according to an exemplary embodiment of the present disclosure.

Referring to FIG. 10A, a driving thin film transistor TFT2, a capacitor Cst, and a data line DL are formed on a substrate 111. Wirings such as a switching thin film transistor TFT1 and a gate line GL may also be formed on the substrate 111.

Figure 10B:
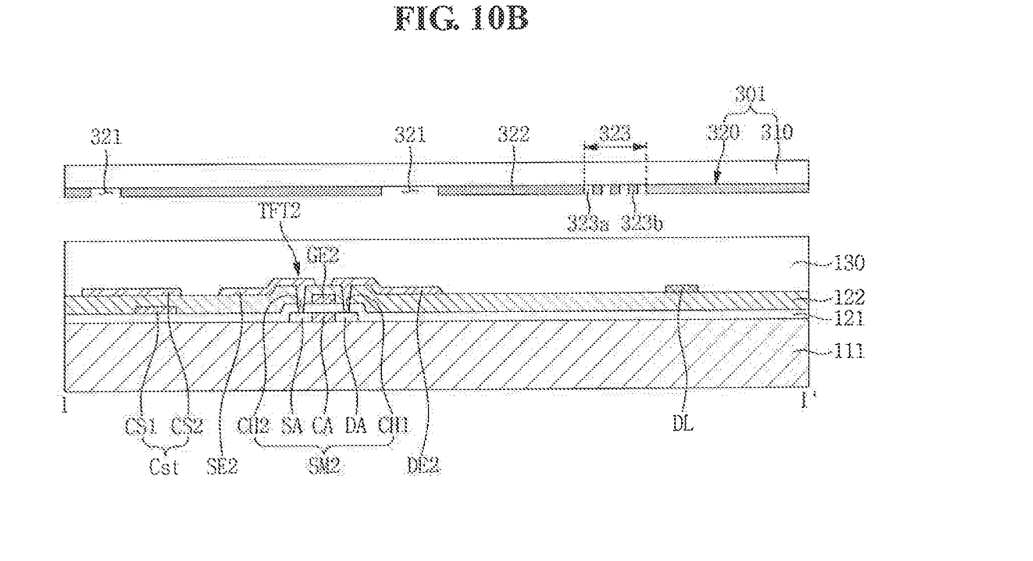

Referring to FIG. 10B, a photosensitive material is applied over an entire surface of the substrate 111 including the driving thin film transistor TFT2 such that a photosensitive material layer 130 is formed. The photosensitive material may use, for example, a photodegradable polymer resin. The photodegradable polymer resin may include polyimide (PI).

In addition, a pattern mask 301 is disposed above the photosensitive material layer 130, spaced apart from the photosensitive material layer 130. The pattern mask 301 includes a mask substrate 310 and a light blocking pattern 320 disposed on the mask substrate 310. The light blocking pattern 320 includes at least three areas, each having different light transmittances. Such a pattern mask 301 may also be referred to as a halftone mask.

The mask substrate 310 may use a transparent glass or plastic substrate. However, the invention is not limited thereto, and the mask substrate 310 may include another material having light transmittance and mechanical strength.

The light blocking pattern 320 may be formed by selectively applying a light blocking material to the mask substrate 310. The blocking pattern 320 includes a transmissive portion 321, a light blocking portion 322, and a semi-light transmissive portion 323.

The transmissive portion 321 is an area through which light is transmitted, and is located above an area to be defined with a third contact hole CH3 and above an area where an eighth contact hole CH8 is to be formed.

The light blocking portion 322 is a portion at which light transmission is blocked, and the light blocking portion 322 may be formed by applying a light blocking material to the mask substrate 310.

The semi-transmissive portion 323 is a portion through which a part of an incident light is transmitted, and it is located above an area to be defined with a recess 135. The semi-light transmissive portion 323 may have a structure in which a light transmissive area 323a and a light blocking slit 323b are alternately disposed. In such an exemplary embodiment, the light transmittance of the semi-light transmissive portion 323 may be adjusted by adjusting an interval between the light transmissive area 323a and the light blocking slit 323b. In an exemplary embodiment of the present disclosure, the light transmittance of the semi-light transmissive portion 323 may be adjusted by adjusting a concentration of the light blocking material.

Figure 10C:
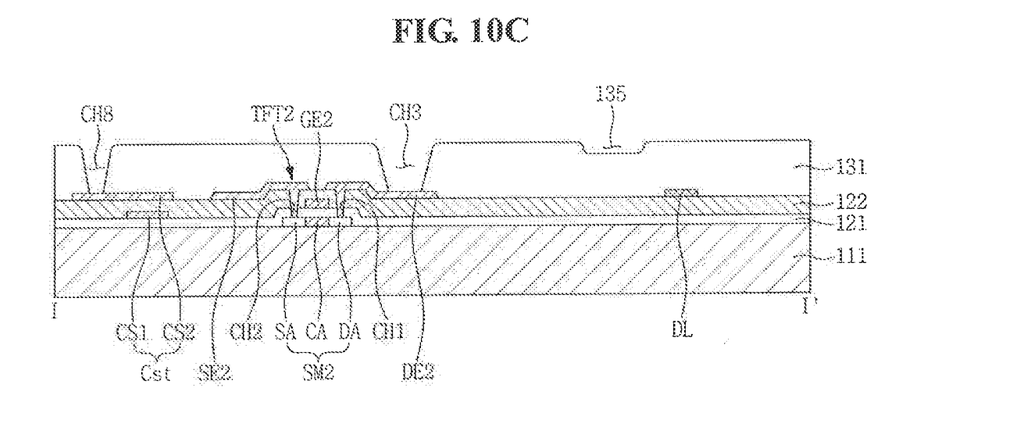

Referring to FIG. 10C, the photosensitive material layer 130 is patterned through exposure and development using the pattern mask 301, such that a first protective layer 131 including the recess 135, the third contact hole CH3 and the eighth contact hole CH8 is formed. For example, the photosensitive material layer 130 is exposed, developed, and then heat cured such that the first protective layer 131 may be formed.

Figure 10D:
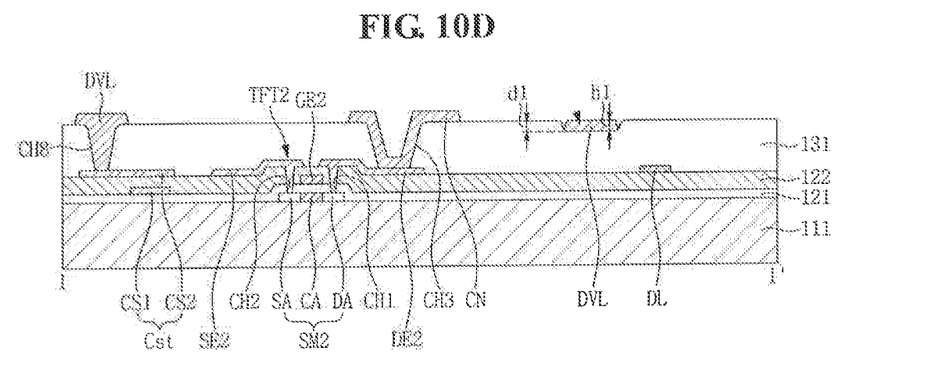

Referring to FIG. 10D, a connection electrode CN and a driving voltage line DVL are formed on the first protective layer 131.

The connection electrode CN is connected to a second drain electrode DE2 through the third contact hole CH3.

The driving voltage line DVL is disposed at the recess 135 defined in the first protective layer 131. In addition, the driving voltage line DVL is connected to a second capacitor plate CS2 through the eighth contact hole CH8. Although not illustrated, the first protective layer 131 has a ninth contact hole CH9, and the driving voltage line DVL is connected to the second capacitor plate CS2 also through the ninth contact hole CH9. Although not illustrated, the driving voltage line DVL is connected to the second source electrode SE2 through a tenth contact hole CH10.

Figure 10E:
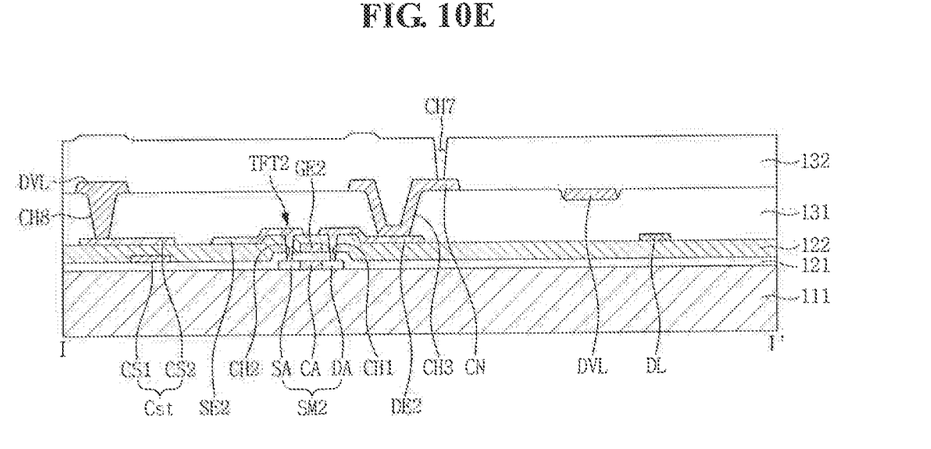

Referring to FIG. 10E, a second protective layer 132 is formed on the connection electrode CN and the driving voltage line DVL. The second protective layer 132 has a seventh contact hole CH7 exposing a part of the connection electrode CN.

The second protective layer 132 may be formed by exposure, development and curing of a photosensitive material.

Figure 10F:
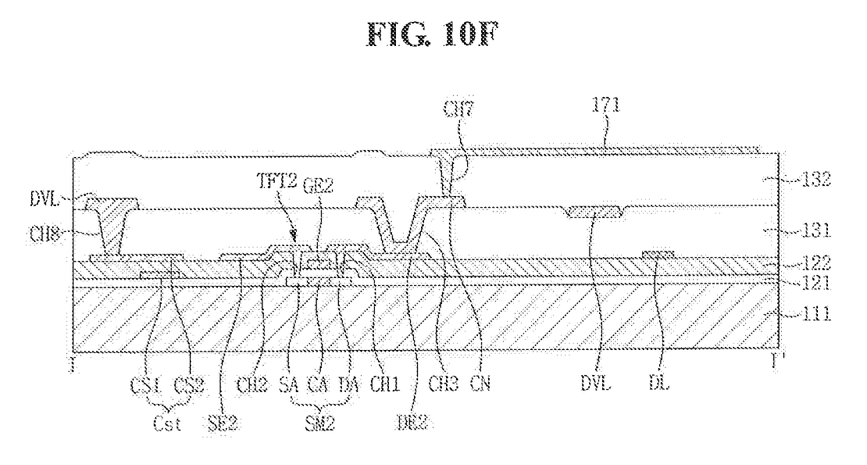

Referring to FIG. 10F, a first electrode 171 is formed on the second protective layer 132.

The first electrode 171 overlaps the recess 135 and the driving voltage line DVL. In addition, the first electrode 171 is connected to the connection electrode CN through the seventh contact hole CH7. The first electrode 171 is connected to the second drain electrode DE2 of the driving thin film transistor TFT2 through the connection electrode CN.

Figure 10G:
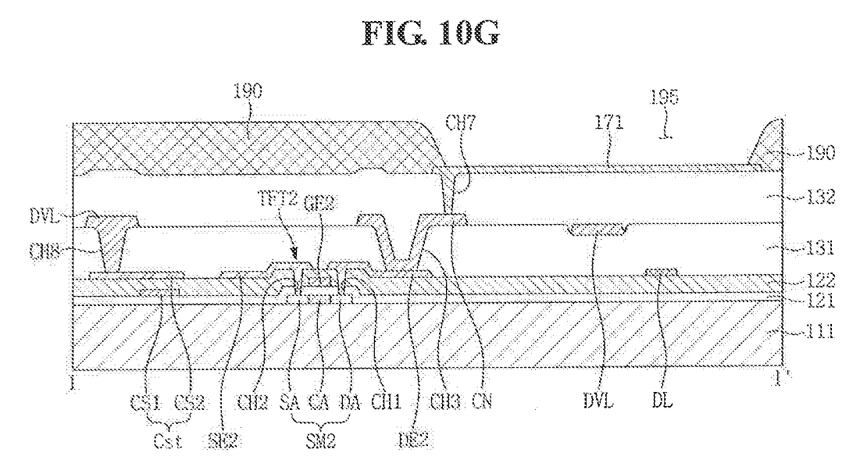

Referring to FIG. 10G, a pixel defining layer 190 is formed above the substrate 111 including the first electrode 171 and the second protective layer 132.

The pixel defining layer 190 may include a photosensitive material, for example, a photodegradable polymer resin. Examples of the photodegradable polymer resin may include a polyimide (PI) resin, a polyacrylic resin, a polyethylene terephthalate (PET) resin, a polyethylene naphthalate (PEN) resin, and the like.

An opening 195 is defined by the pixel defining layer 190. The first electrode 171 is exposed from the pixel defining layer 190 by the opening 195. For example, the pixel defining layer 190 exposes an upper surface of the first electrode 171, and protrudes along the periphery of the first electrode 171. The pixel defining layer 190 overlaps an end portion of the first electrode 171 and the opening 195 is located above the first electrode 171. According to an exemplary embodiment of the present disclosure, the opening 195 is symmetric on a plane with respect to the driving voltage line DVL, which is a conductive line.

Figure 10H:
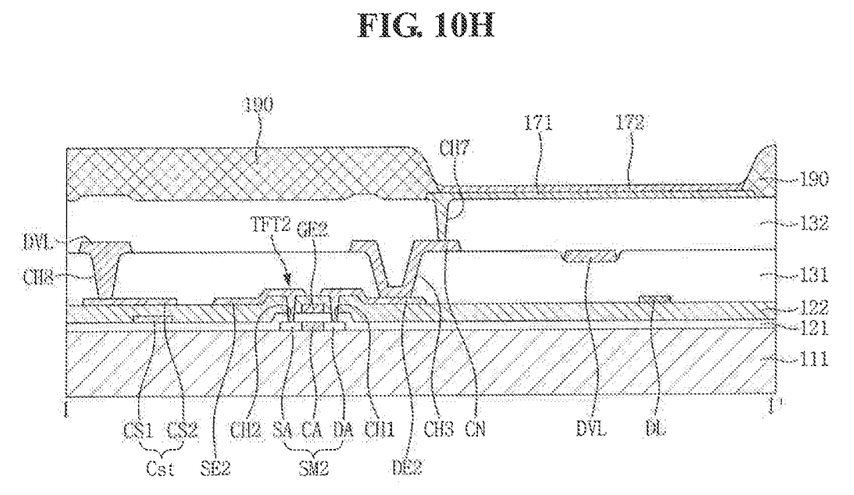

Referring to FIG. 10H, an organic light emitting layer 172 is formed on the first electrode 171 that is exposed by the opening 195 of the pixel defining layer 190. The organic light emitting layer 172 may be formed, for example, by deposition.

Figure 10I:
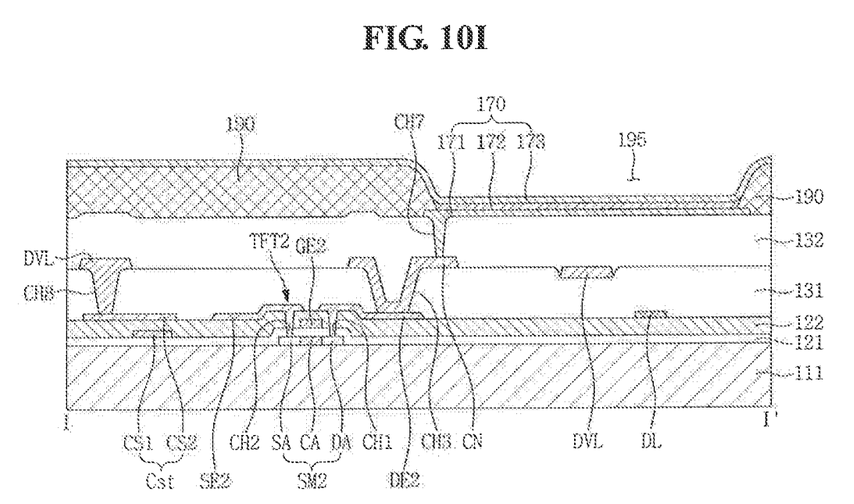

Referring to FIG. 10I, a second electrode 173 is formed on the organic light emitting layer 172. The second electrode 173 is also formed on the pixel defining layer 190. The second electrode 173 may be formed by deposition. In such a manner, the OLED display device 103 illustrated in FIG. 7 may be manufactured.

As set forth hereinabove, in one or more exemplary embodiments of the present disclosure, since the first electrode is disposed symmetrically with respect to the conductive line therebelow, the azimuth angle-dependent color deviation of the OLED display device may be reduced. In addition, in one or more exemplary embodiments of the present disclosure, since the first electrode is disposed on a planar surface, the azimuth angle-dependent color deviation of the OLED display device may be substantially prevented.

While the present invention has been illustrated and described with reference to the exemplary embodiments thereof, it will be apparent to those of ordinary skill in the art that various changes in form and detail may be made thereto without departing from the spirit and scope of the present invention.

What is claimed is:

1. An organic light emitting diode display device comprising:
   a substrate;
   a first protective layer disposed on the substrate;
   a conductive line disposed on the first protective layer;
   a second protective layer disposed on the conductive line;
   a first electrode disposed on the second protective layer;
   an organic light emitting layer disposed on the first electrode; and
   a second electrode disposed on the light emitting layer,
   wherein the first electrode slopes away from and then back towards the conductive line forming a non-planar region thereof and a shape of the non-planer region of the first electrode is symmetrical with respect to a center line of the conductive line in a cross-sectional view.

2. The organic light emitting diode display device as claimed in claim 1, wherein the conductive line is a driving voltage line.

3. The organic light emitting diode display device as claimed in claim 1, wherein the conductive line is substantially straight.

4. The organic light emitting diode display device as claimed in claim 1, wherein the conductive line extends in a radial direction, on a plane, with respect to a center of the first electrode.

5. The organic light emitting diode display device as claimed in claim 4, wherein the conductive line has a lattice shape.

6. The organic light emitting diode display device as claimed in claim 1, further comprising a thin film transistor disposed between the substrate and the first protective layer.

7. The organic light emitting diode display device as claimed in claim 6, wherein the thin film transistor is connected to the first electrode.

8. The organic light emitting diode display device as claimed in claim 6, wherein the thin film transistor is connected to the conductive line.

9. The organic light emitting diode display device as claimed in claim 1, further comprising a pixel defining layer disposed on the second protective layer, the pixel defining layer having an opening that exposes at least a portion of the first electrode.

10. The organic light emitting diode display device as claimed in claim 9, wherein the opening is symmetric, on a plane, with respect to a center of the conductive line.

\* \* \* \* \*